United States Patent
Izumi et al.

(10) Patent No.: US 8,502,321 B2
(45) Date of Patent: Aug. 6, 2013

(54) SEMICONDUCTOR DEVICE AND MANUFACTURING METHOD THEREOF

(75) Inventors: Tatsuo Izumi, Tokyo (JP); Kikuko Sugimae, Yokohama (JP); Hiroyuki Kutsukake, Yokohama (JP); Keisuke Yonehama, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 34 days.

(21) Appl. No.: 13/053,611

(22) Filed: Mar. 22, 2011

(65) Prior Publication Data
US 2012/0061766 A1    Mar. 15, 2012

(30) Foreign Application Priority Data
Sep. 9, 2010   (JP) ................................. 2010-202108

(51) Int. Cl.
*H01L 29/41* (2006.01)
(52) U.S. Cl.
USPC ............ 257/369; 257/773; 257/E23.151; 257/E23.152
(58) Field of Classification Search
USPC .. 257/369, 734, 773, 775, E23.151–E23.152, 257/E21.575, E21.585
See application file for complete search history.

(56) References Cited

U.S. PATENT DOCUMENTS

| | | | | |
|---|---|---|---|---|
| 4,951,259 A * | 8/1990 | Sato et al. | ............... | 365/230.06 |
| 6,770,941 B2 * | 8/2004 | Shinozaki et al. | ............ | 257/369 |
| 6,835,987 B2 | 12/2004 | Yaegashi | | |
| 7,888,214 B2 * | 2/2011 | Teo et al. | ...................... | 438/286 |
| 2006/0131662 A1 * | 6/2006 | Yamada et al. | ............... | 257/374 |
| 2007/0132032 A1 * | 6/2007 | Teo et al. | ...................... | 257/369 |
| 2007/0181882 A1 * | 8/2007 | Lee | .................................. | 257/67 |
| 2008/0265330 A1 * | 10/2008 | Gerhardt et al. | .............. | 257/369 |
| 2009/0081860 A1 * | 3/2009 | Zhou et al. | ..................... | 438/531 |
| 2009/0278208 A1 * | 11/2009 | Chang | ............................ | 257/392 |
| 2010/0202208 A1 * | 8/2010 | Endo et al. | ............... | 365/185.18 |
| 2010/0327367 A1 * | 12/2010 | Richter et al. | ................ | 257/369 |

FOREIGN PATENT DOCUMENTS

| | | |
|---|---|---|
| JP | 2000-340678 | 12/2000 |
| JP | 2002-231832 | 8/2002 |

OTHER PUBLICATIONS

U.S. Appl. No. 09/527,596, filed Mar. 17, 2000, Unknown.

* cited by examiner

*Primary Examiner* — Jarrett Stark
*Assistant Examiner* — Michele Fan
(74) *Attorney, Agent, or Firm* — Oblon, Spivak, McClelland, Maier & Neustadt, L.L.P.

(57) ABSTRACT

A semiconductor device including first and second transistors having first and second gates and first and second source/drain regions, respectively. First and second contacts are electrically connected to the first and the second source/drain regions, respectively. A width of a first bottom surface of the first contacts in a gate width direction of the first-gate is wider than a width of the first bottom surface in a gate length direction of the first-gate. Widths of a second bottom surface of the second-contact are narrower than a longitudinal direction width of the first bottom surface. A high-concentration region is formed between the first source/drain regions and the first-contact. Extending widths of an outline of the high-concentration region extending from an outline of the first bottom surface in the longitudinal direction are larger than extending widths of an outline of the high-concentration region extending from an outline thereof in the short direction.

10 Claims, 15 Drawing Sheets

SEMICONDUCTOR DEVICE AND MANUFACTURING METHOD THEREOF

CROSS REFERENCE TO RELATED APPLICATIONS

This application is based upon and claims the benefit of priority from the prior Japanese Patent Application No. 2010-202108, filed on Sep. 9, 2010, the entire contents of which are incorporated herein by reference.

FIELD

The embodiments of the present invention relate to a semiconductor device and manufacturing method thereof.

BACKGROUND

There has been known a technique of additionally implanting an impurity in a part of a source/drain region of a MOS transistor to which a contact plug is connected to reduce an electric resistance of a connected part of the source/drain region and the contact plug. This additional implantation of an impurity is performed through a contact hole formed in an insulating film on a source/drain region.

When this technique is applied to a case of manufacturing an n-type transistor and a p-type transistor on a same substrate, a mask for closing a contact hole on a source/drain region of a different conductive type from that of the impurity is used to selectively implant a conductive impurity in a source/drain region of a same conductive type as that of the impurity. However, because a photolithography process for forming the mask is required, the number of manufacturing processes is increased.

Further, there has been known a technique of implanting an impurity in a direction tilted from a direction vertical to a region in a substrate between transistors as an implant direction where an impurity enters. When an impurity enters in the direction tilted from the vertical direction, an impurity diffusion region extends largely toward the direction where an impurity enters. Accordingly, when a region that becomes a current path such as a source/drain region is formed, there is a possibility of occurrence of a short channel effect.

DETAILED DESCRIPTION

Embodiments of the present invention disclose a semiconductor device. The semiconductor device comprises first and second transistors, first and second contact plugs, and a high-concentration impurity region. The first transistor is formed on a substrate and comprises a first gate electrode and first source and drain regions. The second transistor is formed on the substrate and comprises a second gate electrode and second source and drain regions of a conductive type different from that of the first source and drain regions. The first contact plug is electrically connected to the first source and drain regions and comprises a first bottom surface which has a longitudinal direction and a short direction. A width of the first bottom surface in a direction parallel to a gate width direction of the first gate electrode is wider than a width of the first bottom surface in a direction parallel to a gate length direction of the first gate electrode. The second contact plug is electrically connected to the second source and drain regions and comprises a second bottom surface. Widths in all directions of the second bottom surface are narrower than the longitudinal direction width of the first bottom surface. High-concentration impurity regions are formed between the first source and drain regions and the first contact plugs. The high-concentration impurity regions are a same conductive type as that of the first source and drain regions. The first contact plug is electrically connected to the first source and drain regions through the high-concentration impurity regions. At least one of extending widths of an outline of the high-concentration impurity region extending from an outline of the first bottom surface in a longitudinal direction is larger than extending widths of an outline of the high-concentration impurity region extending from an outline of the first bottom surface in a short direction.

Embodiments will now be explained with reference to the accompanying drawings.

First Embodiment

A first embodiment of the present invention is an exemplary embodiment for explaining a case where the present invention is applied to a NAND flash memory device.
(Configuration of Semiconductor Device)

Figure 1:
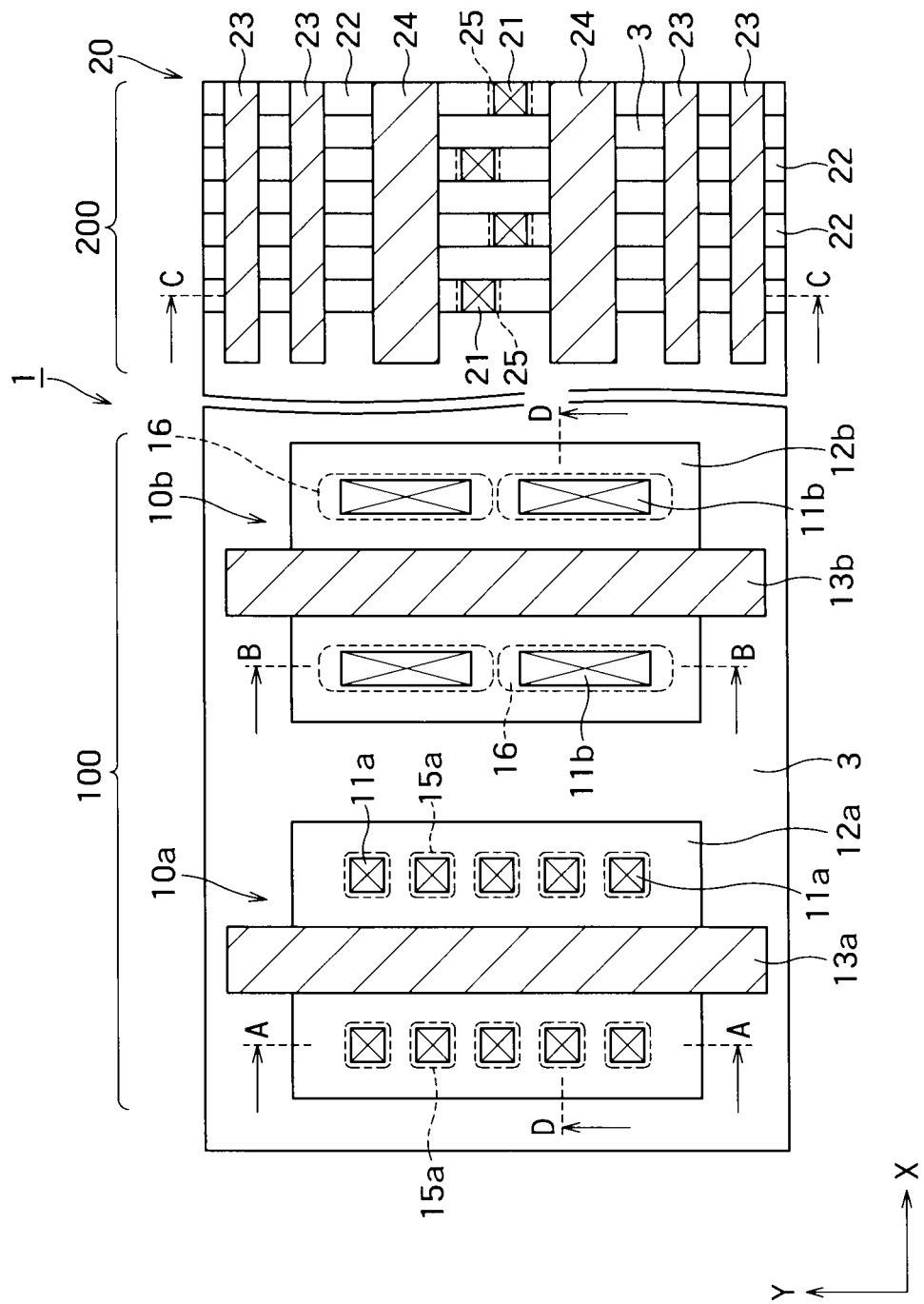
FIG. 1 is a top view of a semiconductor device 1 according to the first embodiment.
Figure 2A:
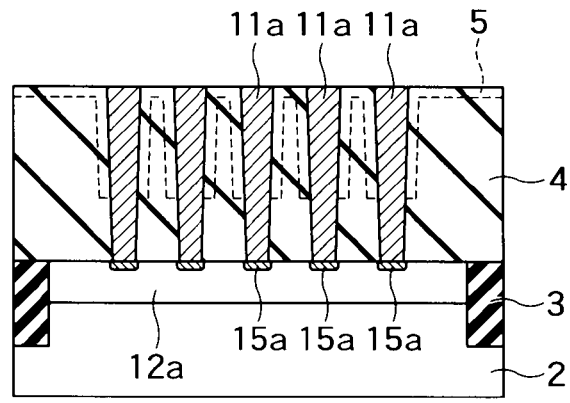
FIGS. 2A, 2B, and 2C are cross-sectional views of the semiconductor device 1 along lines AA, BB, and CC shown in FIG. 1, respectively.
Figure 2B:
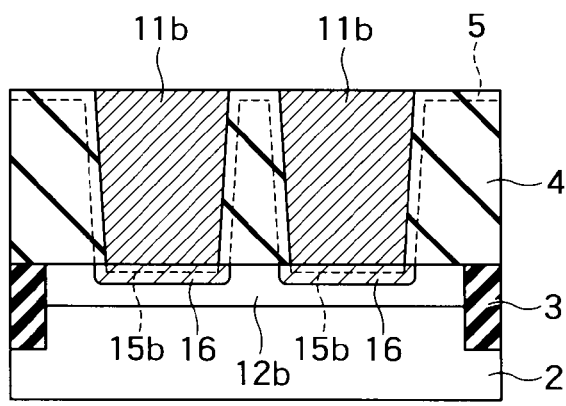
Figure 2C:
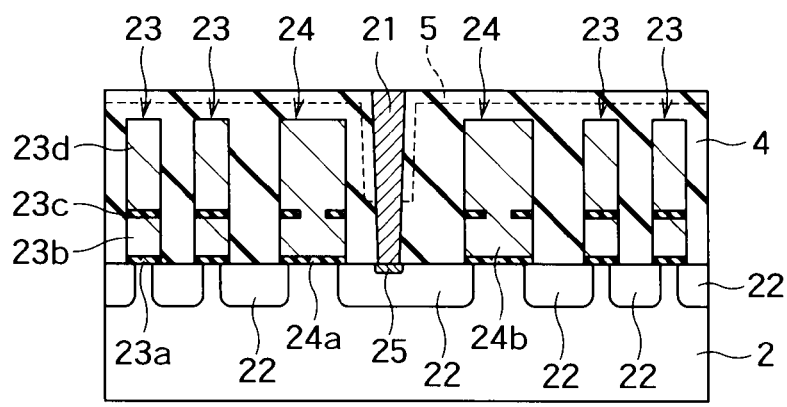
Figure 3:
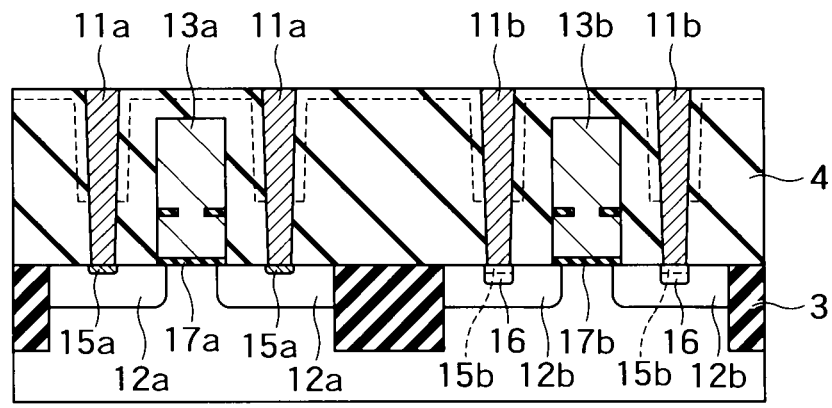
FIG. 3 is a cross-sectional view of the semiconductor device 1 along a line DD shown in FIG. 1.

FIG. 1 is a top view of a semiconductor device 1 according to the first embodiment. FIGS. 2A, 2B, and 2C are cross-sectional views of the semiconductor device 1 along lines AA, BB, and CC shown in FIG. 1, respectively. FIG. 3 is a cross-sectional view of the semiconductor device 1 along a line DD shown in FIG. 1.

The semiconductor device 1 has transistors 10a and 10b formed in a peripheral circuit region 100 on a semiconductor substrate 2, and a memory cell 20 formed in a memory cell region 200. An insulating layer 4 is formed on the transistors 10a and 10b and the memory cell 20. The insulating layer 4 is omitted from FIG. 1.

An active area on the semiconductor substrate 2 where the transistors 10a and 10b and the memory cell 20 are formed is isolated by an isolation insulating film 3. The transistor 10a and the transistor 10b are of different conductive types. The memory cell 20 is of a same conductive type as that of the transistor 10a.

For example, the transistor 10a and the memory cell 20 are of n-type and the transistor 10b is of p-type.

The transistor 10a includes a gate dielectric film 17a on the semiconductor substrate 2, a gate electrode 13a on the gate dielectric film 17a, and a source/drain region 12a in an active area on both sides of the gate electrode 13a.

A contact plug 11a is connected to the source/drain region 12a. A high-concentration impurity region 15a is formed near an interface between the source/drain region 12a and the contact plug 11a in the source/drain region 12a. The high-concentration impurity region 15a reduces an electric resistance of a connected part of the contact plug 11a and the source/drain region 12a. The high-concentration impurity region 15a cannot be formed.

The high-concentration impurity region 15a is formed by additionally implanting an impurity in the source/drain region 12a, and has the same conductive type as that of the source/drain region 12a. Its impurity concentration is higher than that of the source/drain region 12a.

The transistor 10b includes a gate dielectric film 17b on the semiconductor substrate 2, a gate electrode 13b on the gate dielectric film 17b, and a source/drain region 12b on both sides of the gate electrode 13b. A contact plug 11b is connected to the source/drain region 12b.

The contact plug 11b is connected to the source/drain region 12b and a high-concentration impurity region 16 is formed near an interface between the source/drain region 12b and the contact plug 11b in the source/drain region 12b. The high-concentration impurity region 16 reduces an electric resistance of a connected part of the contact plug 11b and the source/drain region 12b.

The high-concentration impurity region 16 is formed by additionally implanting an impurity in the source/drain region 12b and has the same conductive type as that of the source/drain region 12b. Its impurity concentration is higher than that of the source/drain region 12b.

A high-concentration impurity region 15b that is of a different conductive type from that of the high-concentration impurity region 16 is also formed near the interface between the source/drain region 12b and the contact plug 11b in the source/drain region 12b. However, because the impurity concentration of the high-concentration impurity region 15b is lower than that of the high-concentration impurity region 16, the conductive type of the high-concentration impurity region 16 is dominant near the interface between the source/drain region 12b and the contact plug 11b in the source/drain region 12b.

A region 5 in the insulating layer 4 indicated by a dotted line in FIGS. 2 and 3 is a region where an impurity is implanted at the time of forming high-concentration impurity region 16. The region 5 thus contains the same impurity as that of the high-concentration impurity region 16. The region 5 is formed on the entire top surface of the insulating layer 4, on the entire side surface that contacts a side surface of the contact plug 11b parallel to its short direction X2 to be described later, on all side surfaces of the contact plugs 11a and 21, and on an upper part of the side surface that contacts a side surface of the contact plug 11b parallel to its longitudinal direction Y2 to be described later. A region on the insulating layer 4 in which an impurity is implanted at the time of forming the high-concentration impurity regions 15a, 15b, and 25 is omitted from the drawings.

The memory cell 20 includes a plurality of serially-connected stacked-gate-type memory cell transistors 23 and a selective transistor 24 connected to ends of each memory cell transistor 23. By arranging the memory cell transistors 23 and the selective transistors 24 in this manner, a NAND memory cell string is constituted. The memory cell transistor 23 is connected via a source/drain region 22 to the selective transistor 24.

The contact plug 21 is connected to the source/drain region 22 that connects two adjacent selective transistors 24. The high-concentration impurity region 25 is formed near an interface between the source/drain region 22 and the contact plug 21 in the source/drain region 22. The high-concentration impurity region 25 is formed by additionally implanting an impurity in the source/drain region 22 and has the same conductive type as that of the source/drain region 22. Its impurity concentration is higher than that of the source/drain region 22.

The memory cell transistor 23 includes a gate dielectric film 23a on the semiconductor substrate 2, a floating gate 23b on the gate dielectric film 23a, an inter-gate dielectric film 23c on the floating gate 23b, and a control gate 23d on the inter-gate dielectric film 23c. The control gate 23d is shared with an adjacent memory cell 23 in a lateral direction in FIG. 1. Thicknesses of the gate dielectric films 17a, 17b, and 23a are substantially equal to each other. That is, the transistors 10a and 10b are operated at high speed with an operating voltage of 1 V to 5 V. The transistors 10a and 10b are also called "high speed transistors".

The selective transistor 24 includes a gate dielectric film 24a on the semiconductor substrate 2 and a selective gate 24b on the gate dielectric film 24a. The selective gate 24b is shared with an adjacent selective transistor 24 in the lateral direction in FIG. 1.

Figure 4:
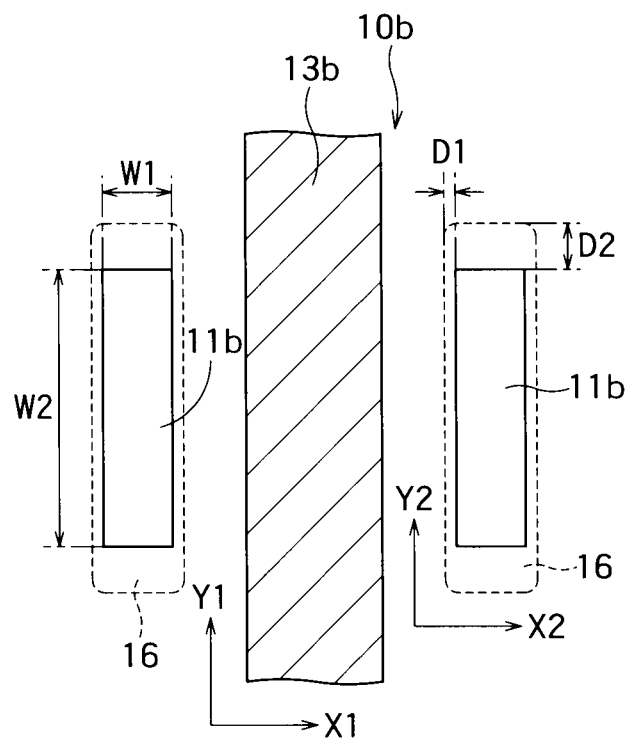
FIG. 4 is an enlarged top view showing the positional relationship between a bottom surface of the contact plug 11b and the high-concentration impurity region 16.

FIG. 4 is an enlarged top view showing the positional relationship between a bottom surface of the contact plug 11b and the high-concentration impurity region 16. Arrows X1 and Y1 in FIG. 4 denote a gate length direction and a gate width direction of the gate electrode 13b, respectively. Arrows X2 and Y2 denote a short direction and a longitudinal direction of the contact plug 11b, respectively.

The bottom surface of the contact plug 11b is formed in a shape that the longitudinal direction and the short direction are provided, such as a rectangle or an ellipse. In the bottom surface of the contact plug 11b, a width W2 in a direction parallel to the gate width direction Y1 of the gate electrode 13b is wider than a width W1 in a direction parallel to the gate length direction X1 of the gate electrode 13b. The longitudinal direction Y2 matches or is similar to the gate width direction Y1 of the gate electrode 13b.

Meanwhile, bottom surfaces of the contact plugs 11a and 21 are formed in a shape that their widths in all directions are narrower than the width of the bottom surface of the contact plug 11b in the longitudinal direction Y2. The shape is a square or a circular shape, for example. Particularly in the contact plug 21, an elliptical contact which is long toward the selective transistor 24 side is used to reduce the electric resistance of the connected part of the source/drain region 22 and the contact plug 21. Even in this case, the bottom surface of the contact plug 21 in a long diameter direction is narrower than the width of the bottom surface of the contact plug 11b in the longitudinal direction Y2.

A width D1 in FIG. 4 denotes an extending width of an outline of the high-concentration impurity region 16 extending from an outline of the bottom surface of the contact plug 11b in the short direction X2. A width D2 denotes an extending width of the outline of the high-concentration impurity region 16 extending from the outline of the bottom surface of the contact plug 11b in the longitudinal direction Y2. The width D2 is larger than the width D1.

The outline of the high-concentration impurity region 16 is a concentration contour line of an impurity that constitutes the high-concentration impurity region 16 at a predetermined concentration. This predetermined concentration is smaller than the maximum impurity concentration of the high-concentration impurity region 16 and larger than the impurity concentration of the source/drain region 12b. And the predetermined concentration is, for example, an intermediate concentration between the maximum impurity concentration of the high-concentration impurity region 16 and the impurity concentration of the source/drain region 12b.

Examples of impurity concentrations of the respective regions are indicated below in a case that the transistor 10a and the memory cell 20 are of n-type and the transistor 10b is of p-type. As or P is used for the n-type impurity and B is used for the p-type impurity.

The impurity concentration of the source/drain regions 12a, 12b, and 22 is $1\times10^{19}$ cm$^{-3}$. The maximum impurity concentration (concentration around the center) of the high-concentration impurity regions 15a, 15b, and 25 is $3\times10^{20}$ cm$^{-3}$. The maximum impurity concentration (concentration around the center) of the high-concentration impurity region 16 is $6\times10^{20}$ cm$^{-3}$.

In this case, the concentration of the outline of the high-concentration impurity region 16 is larger than $1\times10^{19}$ cm$^{-3}$ and smaller than $6\times10^{20}$ cm$^{-3}$, such as $3.05\times10^{19}$ cm$^{-3}$, for example.

Figure 5A:
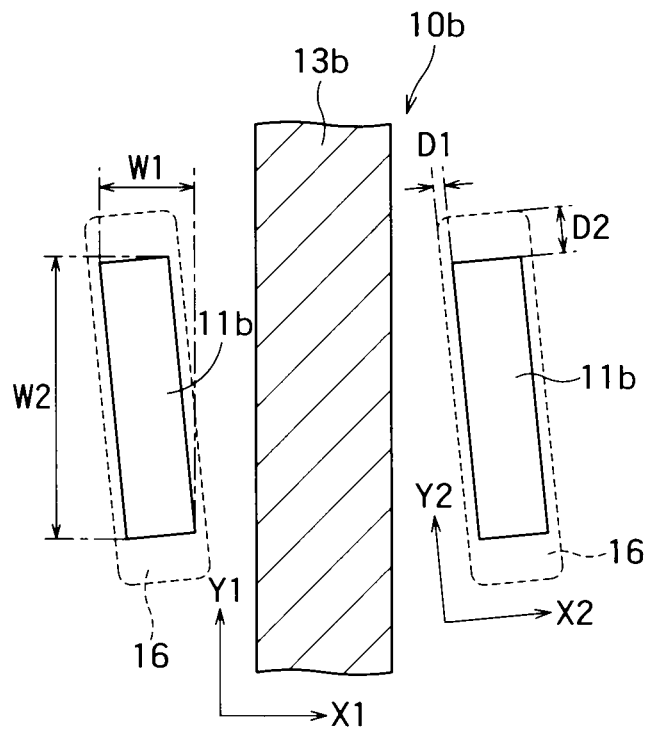
FIGS. 5A(a), 5A(b), 5B(c), and 5B(d) are top views showing modifications of the transistor 10b according to the first embodiment.
Figure 5A:
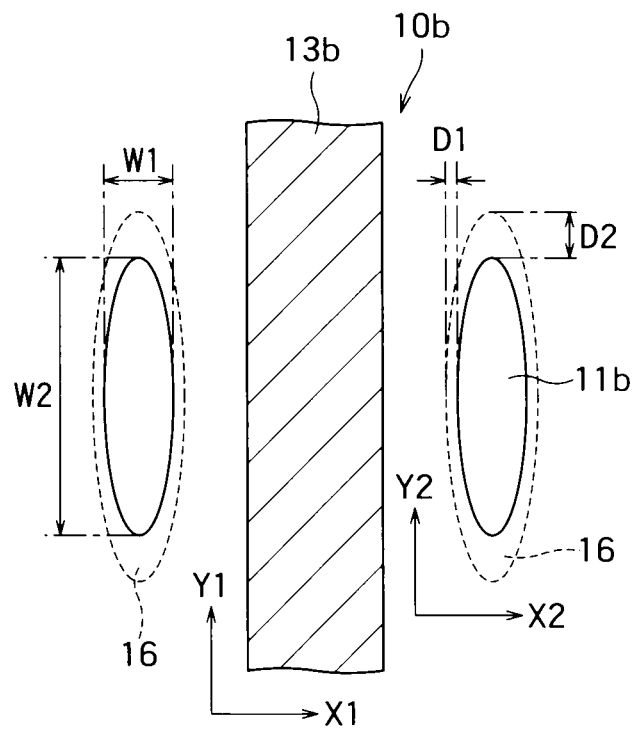

FIGS. 5A(a), 5A(b), 5B(c), and 5B(d) are top views showing modifications of the transistor 10b according to the first embodiment.

FIG. 5A(a) shows the configuration of the transistor 10b when the longitudinal direction Y2 of the contact plug 11b does not match the gate width direction Y1 of the gate electrode 13b. When the longitudinal direction Y2 is shifted greatly from the gate width direction Y1, that is, when the width W1 approximates the width W2, a distance between the high-concentration impurity region 16 and the gate electrode 13b is reduced and thus a short channel effect may occur. Accordingly, a shift of the longitudinal direction Y2 from the gate width direction Y1 is preferably as small as possible. As in the configuration shown in FIG. 4, it is preferable to configure such that the longitudinal direction Y2 matches the gate width direction Y1.

FIG. 5A(b) shows the configuration of the transistor 10b when the bottom surface of the contact plug 11b is formed in an elliptical shape. In this case, the high-concentration impurity region 16 is also formed in a substantially elliptical shape. The width D2 is a distance from a long-diameter direction top of the ellipse of the contact plug 11b to a long-diameter direction top of the ellipse of the high-concentration impurity region 16. The width D1 is a distance from a short-diameter direction top of the eclipse of the contact plug 11b to a short-diameter direction top of the eclipse of the high-concentration impurity region 16. Also in this configuration, the width D2 is larger than the width D1.

Figure 5B:
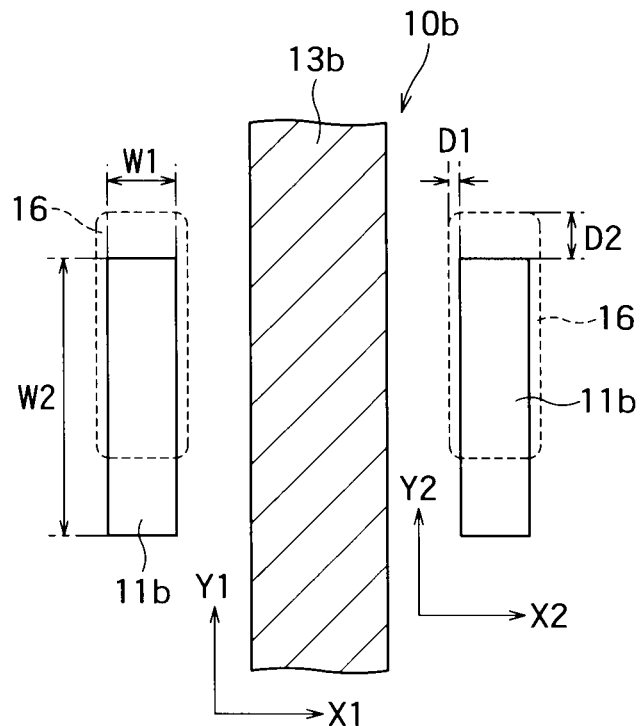
Figure 5B:
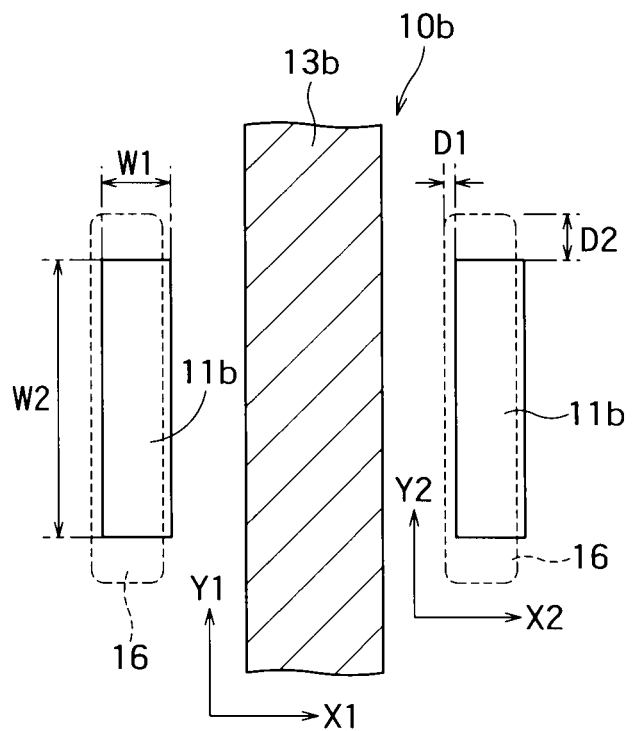

FIG. 5B(c) shows the configuration of the transistor 10b when an end of the bottom surface of the contact plug 11b in the longitudinal direction Y2 (lower end in FIG. 5B(c)) is outside the outline of the high-concentration impurity region 16.

In the configuration shown in FIG. 5B(c), the outline of the high-concentration impurity region 16 extends from the outline of the bottom surface of the contact plug 11b in the longitudinal direction Y2 only in one side (upper side in FIG. 5B(c)). Alternatively, while the outline of the high-concentration impurity region 16 extends in both directions in the longitudinal direction Y2, one extending width can be smaller than the width D1.

That is, at least one of the widths D2 that the outline of the high-concentration impurity region 16 extends from the outline of the bottom surface of the contact plug 11b in the longitudinal direction Y2 is larger than the width D1 that the outline of the high-concentration impurity region 16 extends from the outline of the bottom surface of the contact plug 11b in the short direction X2.

FIG. 5B(d) shows the configuration of the transistor 10b when one end of the bottom surface of the contact plug 11b in the short direction X2 (right end in FIG. 5B(d)) is outside the outline of the high-concentration impurity region 16.

According to the configuration shown in FIG. 5B(d), the outline of the high-concentration impurity region 16 extends from the outline of the bottom surface of the contact plug 11b in the short direction X2 only in one side (left side in FIG. 5B(d)). Also in this configuration, the width D2 is larger than the width D1.

The semiconductor substrate 2 is made of a Si based crystal including a Si crystal.

The isolation region 3 is made of an insulating material such as $SiO_2$ and has an STI (Shallow Trench Isolation) structure.

The gate electrodes 13a and 13b, the control gate 23b, and the floating gate 23d are made of a conductive material such as polycrystalline Si containing a conductive impurity.

The gate dielectric films 17a, 17b, 23a, and 24a and the inter-gate dielectric film 23c are made of an insulating material such as $SiO_2$.

The contact plugs 11a, 11b, and 21 are made of a conductive material such as W. Surfaces of the contact plugs 11a, 11b, and 21 can be covered by a barrier metal.

The insulating layer 4 is made of an insulating material such as $SiO_2$.

An example of a manufacturing method of the semiconductor device 1 according to the first embodiment is explained next.

(Manufacturing of Semiconductor Device)

FIGS. 6 to 11 are cross-sectional views showing a manufacturing process of the semiconductor device 1 according to the first embodiment. FIGS. 6A, 7A, 8A, 9A, 10A, and 11A represent cross sections corresponding to that of FIG. 2A, FIGS. 6B, 7B, 8B, 9B, 10B, and 11B represent cross sections corresponding to that of FIG. 2B, and FIGS. 6C, 7C, 8C, 9C, 10C, and 11C represent cross sections corresponding to that of FIG. 2C.

Figure 6A:
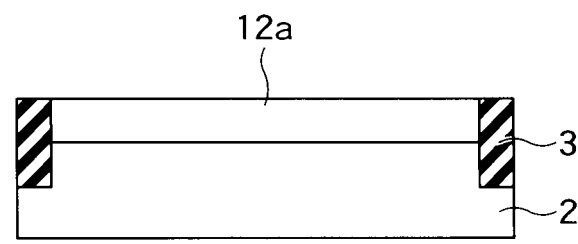
FIGS. 6 to 11 are cross-sectional views showing a manufacturing process of the semiconductor device 1 according to the first embodiment.
Figure 6B:
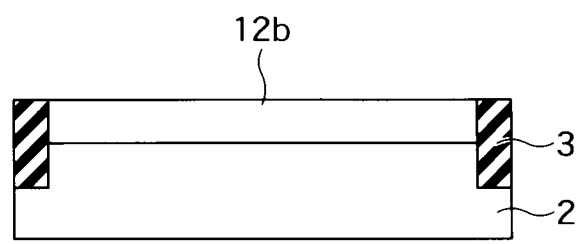
Figure 6C:
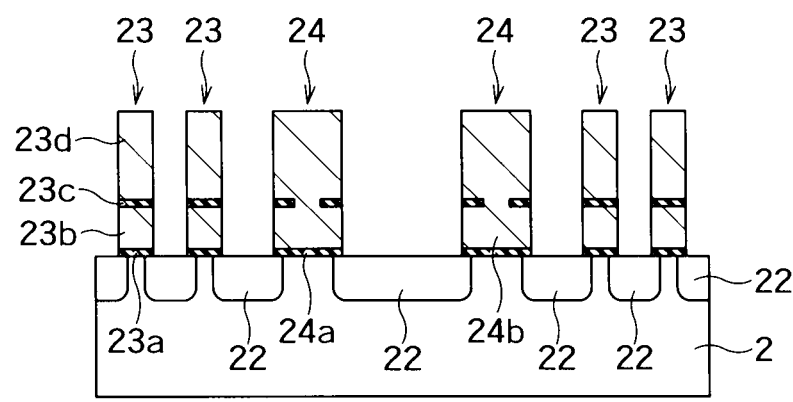

As shown in FIGS. 6A to 6C, the isolation region 3, the source/drain regions 12a, 12b, and 22, the memory cell transistor 23, and the selective transistor 24 are formed on the semiconductor substrate 2. Although not shown in the cross-sections of FIGS. 6A to 6C, the gate dielectric films 17a and 17b and the gate electrodes 13a and 13b are also formed.

Figure 7A:
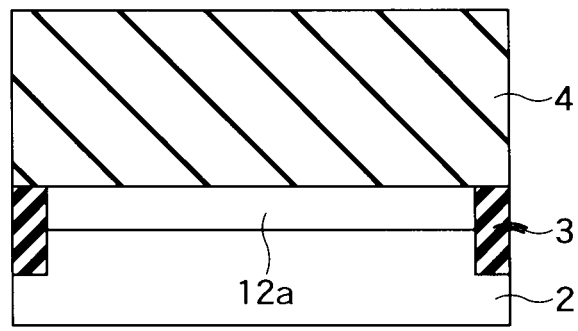
Figure 7B:
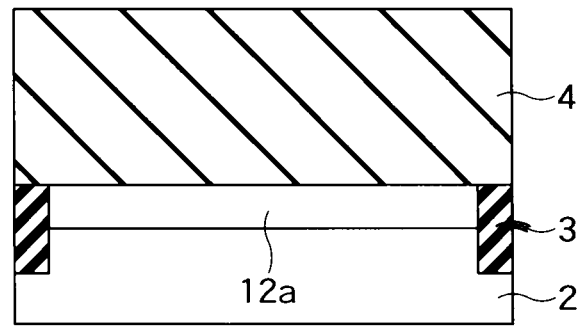
Figure 7C:
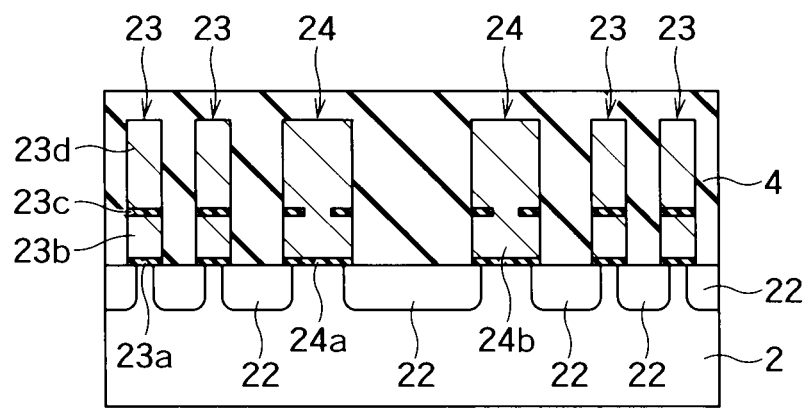

As shown in FIGS. 7A to 7C, an insulating material is deposited on the entire semiconductor substrate 2, so that the insulating layer 4 is formed.

Figure 8A:
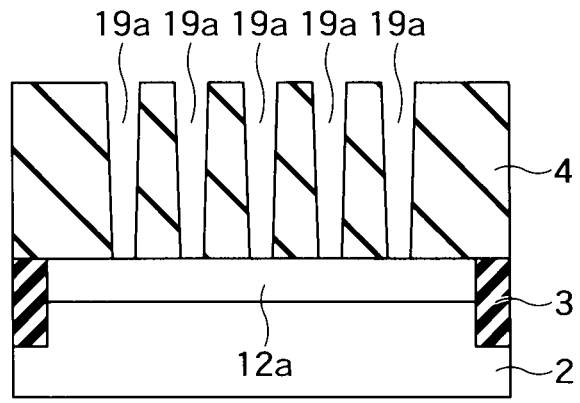
Figure 8B:
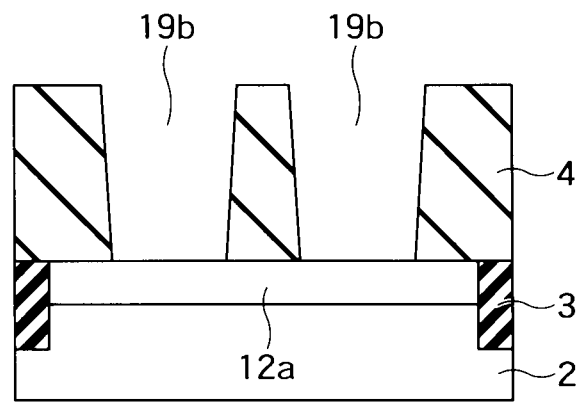
Figure 8C:
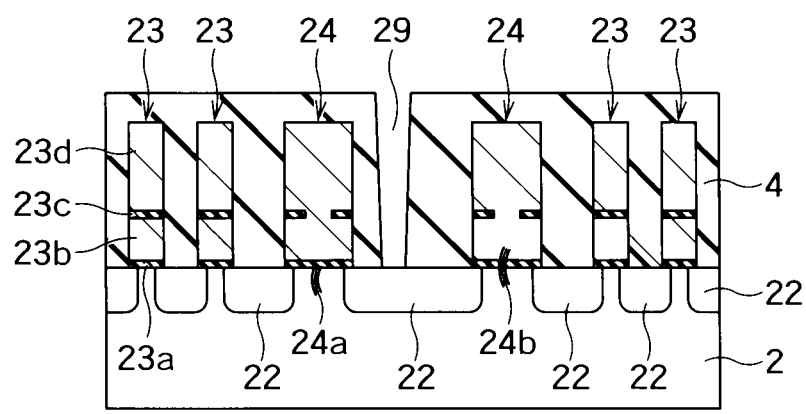

Next, as shown in FIGS. 8A to 8C, contact holes 19a, 19b, and 29 are formed in the insulating layer 4. A bottom surface of the contact hole 19b is formed so that its width in the direction parallel to the gate width direction Y1 of the gate electrode 13b (that is substantially equal to the width W2 in the direction parallel to the gate width direction Y1 of the gate electrode 13b) is wider than its width in the direction parallel to the gate length direction X1 of the gate electrode 13b (that is substantially equal to the width W1 in the direction parallel to the gate length direction X1 of the gate electrode 13b). Bottom surfaces of the contact holes 19a and 29 are formed so that their widths in all directions are narrower than the width of the bottom surface of the contact hole 19b in the direction parallel to the gate width direction Y1 of the gate electrode 13b.

Figure 9A:
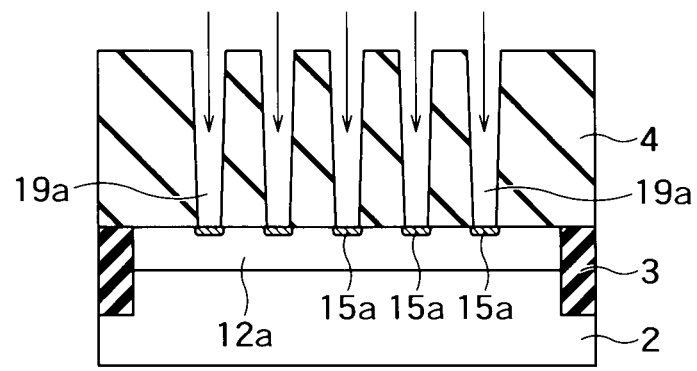
Figure 9B:
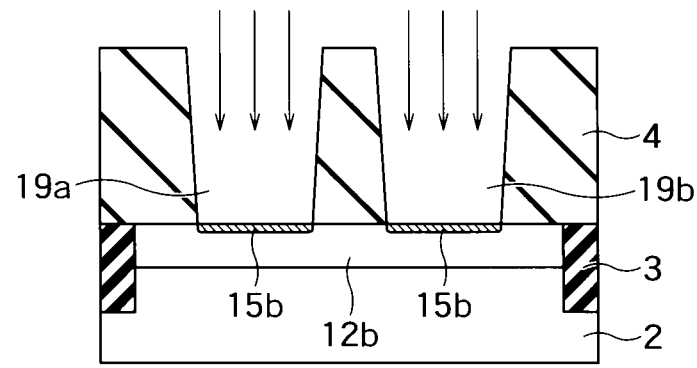
Figure 9C:
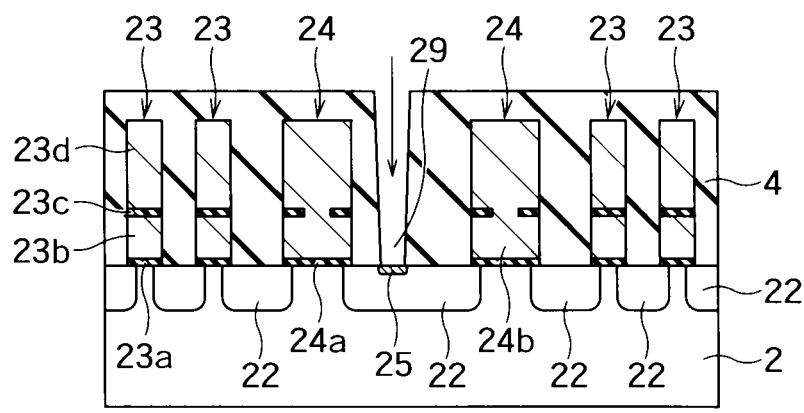

Next, as shown in FIGS. 9A to 9C, an impurity which has the same conductive type as that of the source/drain regions 12a and 22 (such as n-type) is implanted in the entire semiconductor substrate 2 with its entering direction being substantially vertical to the surface of the direction semiconductor substrate 2. An impurity is thus implanted in the source/drain regions 12a, 12b, and 22 exposed at the bottoms of the contact holes 19a, 19b, and 29, so that the high-concentration impurity regions 15a, 15b, and 25 are formed. When these high-concentration impurity regions 15a, 15b, and 25 are not formed, this process is omitted.

When an n-type impurity is implanted in this process, the concentration of the implantation is $1 \times 10^{15}$ cm$^{-2}$, for example.

Alternatively, an impurity can be implanted after forming a mask so as to selectively close an open part of the contact hole 19b by lithography. In this case, the high-concentration impurity region 15b is not formed and only the high-concentration impurity regions 15a and 25 are formed.

Figure 10A:
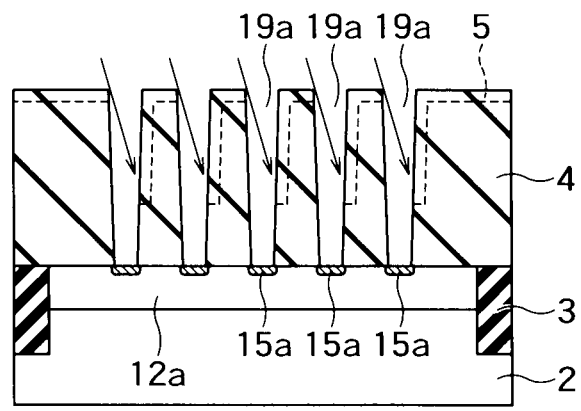
Figure 10B:
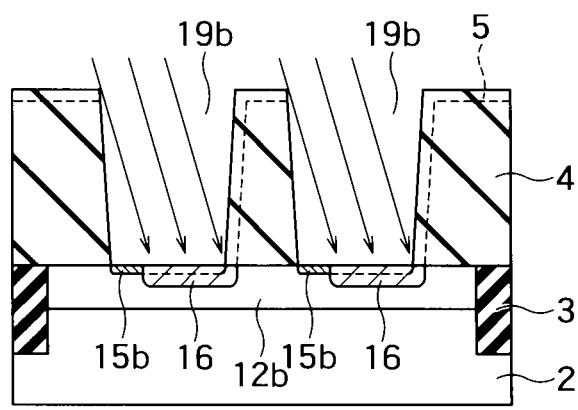
Figure 10C:
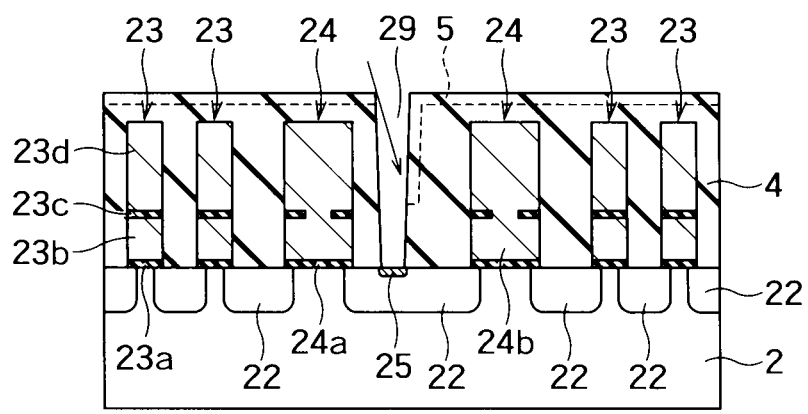

Next, as shown in FIGS. 10A to 10C, an impurity that is of the same conductive type as that of the source/drain region 12b (such as p-type) is implanted in the entire semiconductor substrate 2 with its entering direction being tilted from the direction vertical to the surface of the semiconductor substrate 2. An impurity is thus selectively implanted in the source/drain region 12b exposed at the bottom of the contact hole 19b, so that the high-concentration impurity region 16 is formed.

When a p-type impurity is implanted in this process, the concentration of the implantation is $1 \times 10^{15}$ cm$^{-2}$ to $3 \times 10^{15}$ cm$^{-2}$, for example.

Figure 12A:
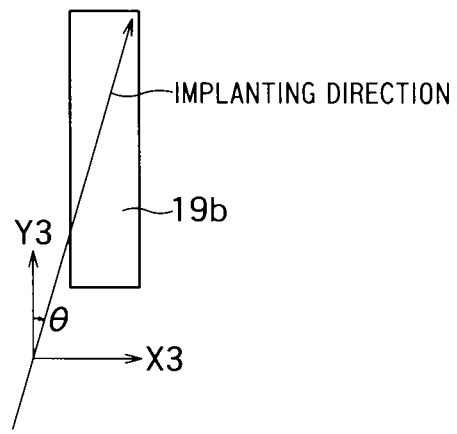
FIGS. 12A and 12B are top views showing the relationship between the arrangement of the bottom surface of the contact hole 19b and a horizontal component of the implant direction where an impurity enters.
Figure 12B:
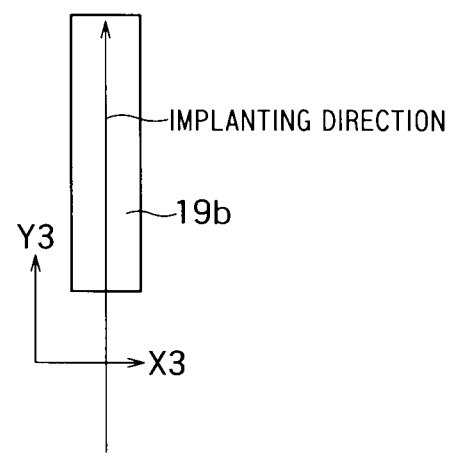

The implant direction where an impurity enters is specifically indicated with reference to FIGS. 12A and 12B.

FIGS. 12A and 12B are top views showing the relationship between the arrangement of the bottom surface of the contact hole 19b and a horizontal component of the implant direction where an impurity enters (component in a direction horizontal with respect to the surface of the semiconductor substrate 2).

As shown in FIG. 12A, the implant direction where an impurity enters is a direction where a twist angle θ based on the longitudinal direction Y3 of the bottom surface of the contact hole 19b (that is substantially equal to the longitudinal direction Y2 of the bottom surface of the contact plug 11b) is equal to or larger 0° and less than 45°.

The twist angle θ based on the longitudinal direction Y3 represents an amount of twist of the horizontal component of the implant direction where an impurity enters from the longitudinal direction Y3, and corresponds to an angle formed by the horizontal component of the implant direction where an impurity enters and the longitudinal direction Y3.

When the twist angle is increased, the width of the high-concentration impurity region 16 in the longitudinal direction Y2 is reduced and the electric resistance of the connected part of the contact plug 11b and the source/drain region 12b may not be reduced sufficiently. Particularly when the twist angle is larger than 45°, the horizontal component of the implant direction where an impurity enters is not toward the longitudinal direction Y3 but toward the short direction X3 (that is substantially equal to the short direction X2 of the bottom surface of the contact plug 11b). The twist angle is thus required to be less than 45°.

Because of such reasons, it is particularly preferable that the twist angle is 0° as shown in FIG. 12B.

As shown in FIG. 4, because the horizontal component of the implant direction where an impurity enters matches or is similar to that of the longitudinal direction Y3, the width D2 is larger than width D1.

Meanwhile, because the implant direction where an impurity enters is tilted from the direction vertical to the surface of the semiconductor substrate 2, the impurity does not reach the bottoms of the contact holes 19a and 29 having reduced widths in all directions (all impurities that enter the contact holes 19a and 29 are implanted in the upper part of the insulating layer 4 exposed at the side surfaces of the contact holes 19a and 29). Even when an impurity reaches the bottoms of the contact holes 19a and 29, the concentration of the impurity implanted in the source/drain regions 12a and 22 exposed at the bottoms of the contact holes 19a and 29 is lower than that of the impurity implanted in the source/drain region 12b exposed at the bottom of the contact hole 19b.

Figure 11A:
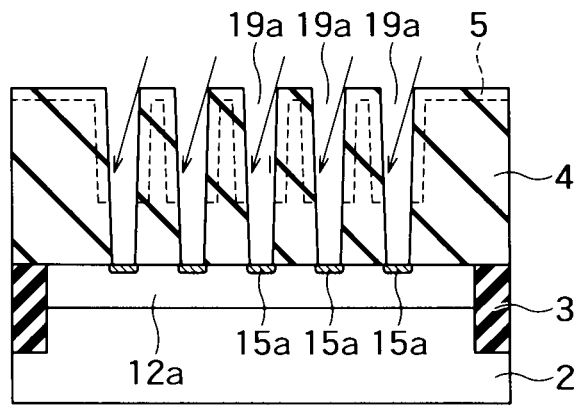
Figure 11B:
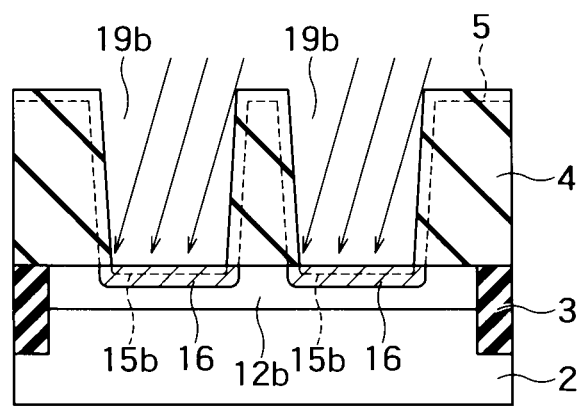
Figure 11C:
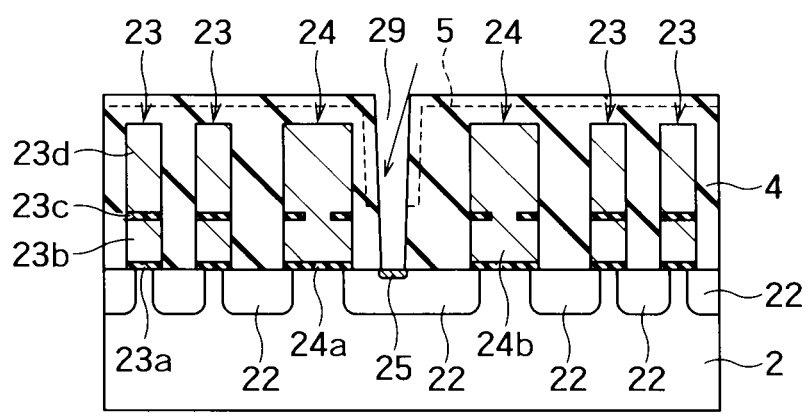

Next, as shown in FIGS. 11A to 11C, an impurity is implanted in the entire semiconductor substrate 2 in a direction having the horizontal component opposite to a horizontal component of the implant direction where an impurity enters shown in FIGS. 10A to 10C. Conditions satisfied by the implant direction where an impurity enters in this process are the same as those of the process shown in FIGS. 10A to 10C. The high-concentration impurity region 16 is thus formed in the entire source/drain region 12b exposed at the bottom of the contact hole 19b.

Because an impurity is implanted around the center of the high-concentration impurity region 16 in the processes shown in FIGS. 10 and 11, this part probably has higher impurity concentration and is deeper than other parts.

When the process shown in FIGS. 11A to 11C is omitted, the configuration of the transistor 10b becomes that shown in FIG. 5B(c). In order to further reduce the electric resistance of the connected part of the contact plug 11b and the source/drain region 12b, this process is preferably performed to form the configuration shown in FIG. 4.

Because the widths of the bottom surfaces of the contact holes 19a and 29 in all directions are narrower than the width of the bottom surface of the contact hole 19b in the longitudinal direction Y3, any impurity implanted to form the high-concentration impurity region 16 hardly reaches the bottoms of the contact holes 19a and 29 or does not reach at all regardless of the angle at which the transistors 10a and 10b and the memory cell 20 are arranged.

Accordingly, even when a plurality of the transistors 10a and 10b and the memory cells 20 having different arrangement angles are formed, the high-concentration impurity region 16 can be formed in each transistor 10b without any impurity hardly reaching the bottoms of the contact holes 19a and 29 or not reaching there at all.

After the high-concentration impurity region 16 is formed, the high-concentration impurity regions 15a, 15b, and 25 can be formed. When the high-concentration impurity regions 15a, 15b, and 25 are of n-type and the high-concentration impurity region 16 is of p-type, the high-concentration impurity region 16 is preferably formed after the high-concentration impurity regions 15a, 15b, and 25 are formed. When the high-concentration impurity regions 15a, 15b, and 25 are of p-type and the high-concentration impurity region 16 is of n-type, the high-concentration impurity regions 15a, 15b, and 25 are preferably formed after the high-concentration impurity region 16 is formed. This is because, when a heavy p-type impurity such as As or P is implanted subsequent to a light n-type impurity such as B, the n-type impurity is pushed to diffuse into an undesirable region, since the high-concentration impurity region 15*b* and the high-concentration impurity region 16 are formed so that parts of them overlap with each other.

Thereafter, activation annealing is performed to activate the implanted impurity. At this time, the width of the high-concentration impurity region 15*a*, the width of the high-concentration impurity region 15*b* in the short direction X2, and the width of the high-concentration impurity region 25 in a direction where the selective transistor 24 is adjacent thereto may be larger than those of the bottoms of the contact holes 19*a*, 19*b*, and 29 because of thermal diffusion. A conductive material is then embedded in the contact holes 19*a*, 19*b*, and 29, so that the contact plugs 11*a*, 11*b*, and 21 are formed.

Effects of First Embodiment

According to the first embodiment, the high-concentration impurity region 16 can be selectively formed in the transistor 10*b* without a lithography process. Accordingly, the number of processes of manufacturing the semiconductor device 1 can be reduced and manufacturing costs can be reduced.

Further, because the longitudinal direction Y2 of the bottom surface of the contact plug 11*b* in which the high-concentration impurity region 16 extends largely matches or is similar to the gate width direction Y1 of the gate electrode 13*b*, the high-concentration impurity region 16 extends a little toward the gate electrode 13*b* side and thus occurrence of a short channel effect caused by the high-concentration impurity region 16 approaching excessively to the gate electrode 13*b* can be suppressed.

Particularly when the transistor 10*b* is a high speed transistor, the gate electrode 13*b* is arranged near the contact plug 11*b*. The high-concentration impurity region 16 thus tends to approach to the gate electrode 13*b*. When the transistor 10*b* is a high speed transistor, the first embodiment becomes particularly effective.

Because the semiconductor device 1 according to the first embodiment is a NAND flash memory device having a NAND memory cell string and the distance between the contact plug 11*b* and the gate electrode 13*b* for the transistor 10*b* in the peripheral circuit region 100 is relatively short, it is very important to suppress occurrence of a short channel effect.

Second Embodiment

Figure 13:
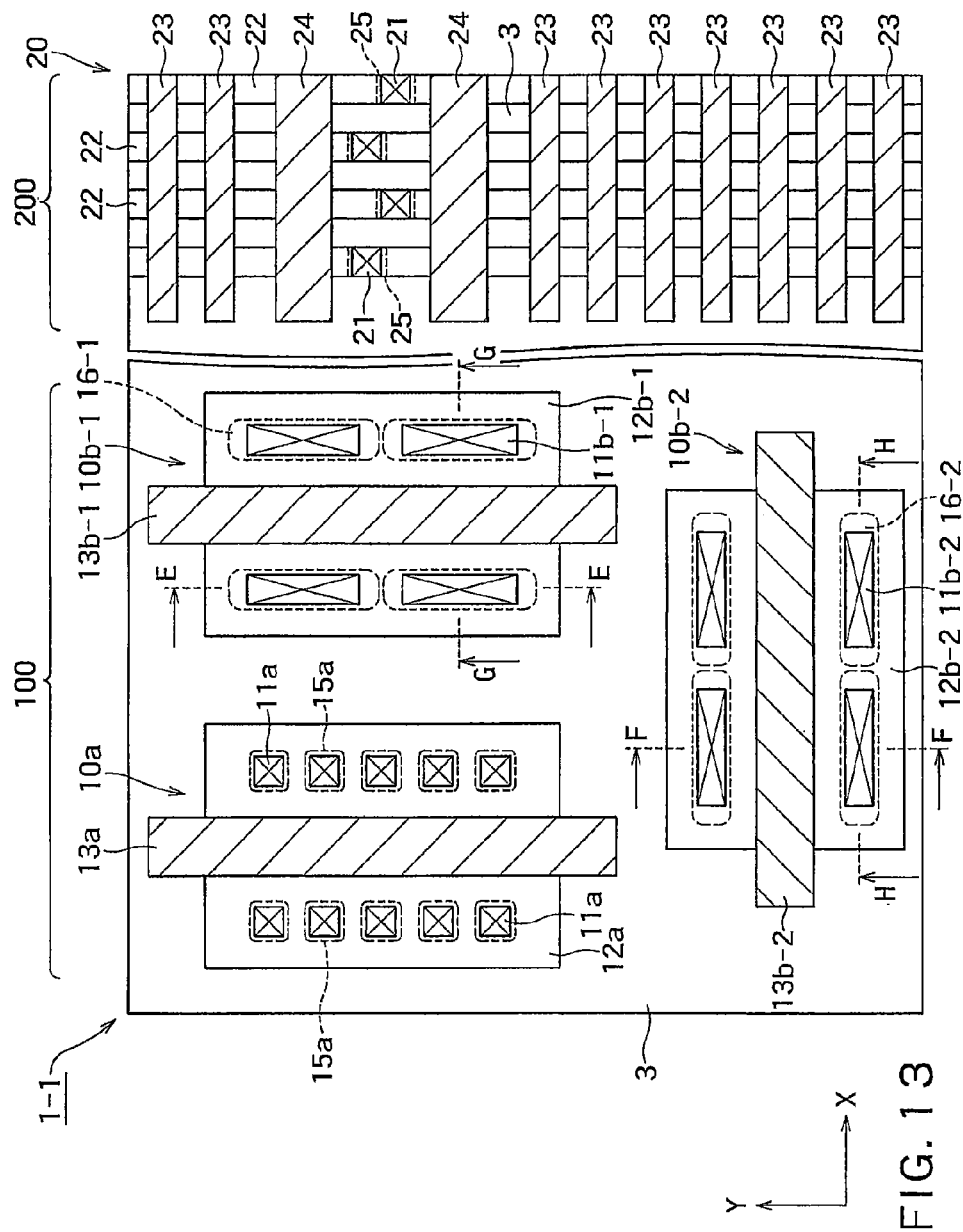
FIG. 13 is a top view of a semiconductor device 1-1 of a second embodiment of the present invention.

FIG. 13 is a top view of a semiconductor device 1-1 of a second embodiment of the present invention. The second embodiment is different from the first embodiment in that a transistor 10*b*-2 is provided in addition to the transistor 10*b* (referred to as "transistor 10*b*-1" in the second embodiment).

The transistor 10*b*-2 is obtained by rotating the transistor 10*b*-1 by 90 degrees. That is, an extending direction where a gate electrode of the transistor 10*b*-2 extends is an X direction. A longitudinal direction of a contact plug 11*b*-2 of the transistor 10*b*-2 is the X direction and its short direction is a Y direction.

In other words, the semiconductor device 1-1 is an embodiment in which p-type transistors 10*b* has different longitudinal directions of the contact 11*b*.

(Manufacturing of Semiconductor Device)

Figure 14A:
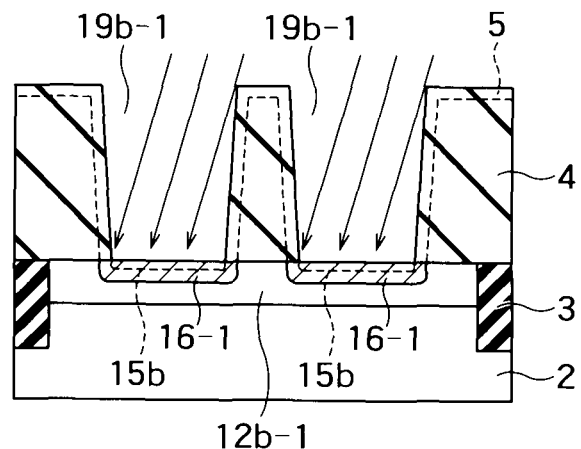
FIGS. 14 and 15 are cross-sectional views showing a manufacturing process of the semiconductor device 1-1 according to the second embodiment.
Figure 14B:
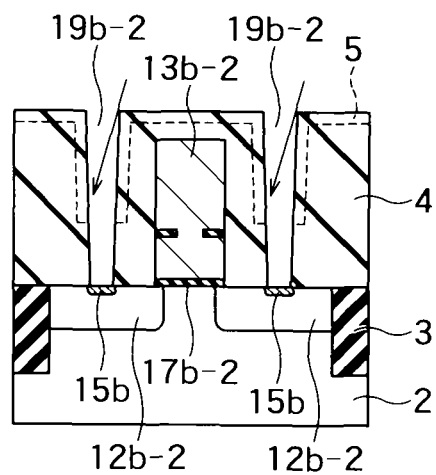
Figure 15A:
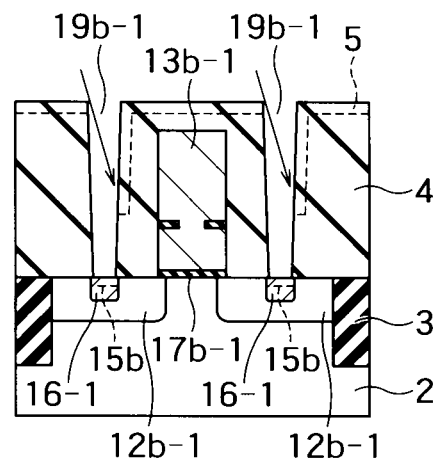
Figure 15B:
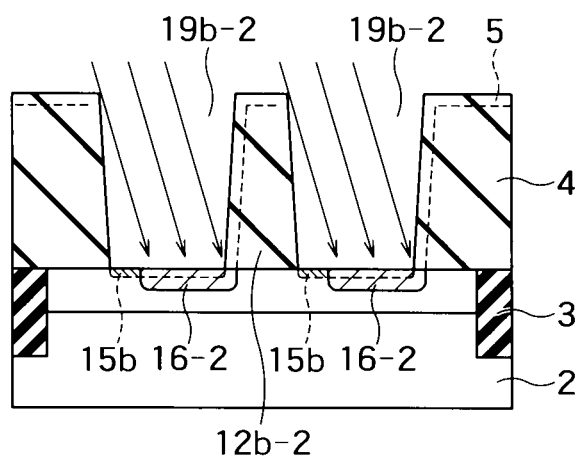

FIGS. 14 and 15 are cross-sectional views showing a manufacturing process of the semiconductor device 1-1 according to the second embodiment. FIG. 14A shows a cross-section corresponding to a cross-section along a line EE shown in FIG. 13. FIG. 14B shows a cross-section corresponding to a cross-section along a line FF shown in FIG. 13. FIG. 15A shows a cross-section corresponding to a cross-section along a line GG shown in FIG. 13. FIG. 15B shows a cross-section corresponding to a cross-section along a line HH shown in FIG. 13. Because processes up to FIGS. 6 to 11 are identical to those of the first embodiment, explanations thereof are omitted.

FIGS. 14A and 14B show a case of applying a part of the manufacturing process of the semiconductor device 1 corresponding to FIGS. 11A to 11C to the semiconductor device 1-1. As shown in FIG. 14A, a high-concentration impurity region 16-1 is formed by the processes of FIGS. 10 and 11. The twist angle of impurity implantation in this process is 0°. The twist angle is defined by the same manner as that of FIGS. 12A and 12B.

However, as shown in FIG. 14B, in the transistor 10*b*-2, the implant direction where an impurity enters is tilted toward a short direction having a reduced width as compared to that of a longitudinal direction. Accordingly, any impurity does not reach the bottom of a contact hole 19*b*-2 (all impurities entering the contact hole 19*b*-2 are implanted in the upper part of the insulating layer 4 exposed at the side surface of the contact hole 19*b*-2).

Therefore, as shown in FIGS. 15A and 15B, an impurity is implanted at a twist angle θ of 90°. As shown in FIG. 15B, the direction where an impurity enters is tilted toward the longitudinal direction of the contact hole 19*b*-2. An impurity is thus selectively implanted in a source/drain region 12*b*-2 exposed at the bottom of the contact hole 19*b*-2, so that a high-concentration impurity region 16-2 is formed.

Meanwhile, as shown in FIG. 15A, in the transistor 10*b*-1, the implant direction where an impurity enters is tilted toward the short direction having a reduced width as compared to that of the longitudinal direction. Accordingly, any impurity does not reach the bottom of the contact hole 19*b*-1 (all impurities entering the contact hole 19*b*-1 are implanted in the upper part of the insulating layer 4 exposed at the side surface of the contact hole 19*b*-1). However, the high-concentration impurity region 16-1 has been already formed by the processes of FIGS. 10 and 11.

Even in this case, because the widths of the bottom surfaces of the contact holes 19*a* and 29 in all directions are narrower than the longitudinal direction widths of the bottom surfaces of the contact holes 19*b*-1 and 19*b*-2, any impurity implanted to form the high-concentration impurity regions 16-1 and 16-2 hardly reaches the bottoms of the contact holes 19*a* and 29 or does not reach there at all regardless of the angle at which the transistors 10*a* and 10*b* and the memory cell 20 are arranged.

Thereafter, an impurity is implanted at a twist angle θ of 270° as in the process of FIGS. 15A and 15B. The high-concentration impurity region 16-2 is thus formed in the entire source/drain region 12*b*-2 exposed at the bottom of the contact hole 19*b*-2.

That is, according to the second embodiment, the high-concentration impurity region 16-1 of the p-type transistor 10*b*-1 and the high-concentration impurity region 16-2 of the p-type transistor 10*b*-2 are formed by implanting an impurity for four times. Twist angles θ of the impurity implantation are 0°, 90°, 180°, and 270°, respectively.

In order to reduce the number of implantation, the impurity implantation can be performed twice at twist angles of 45° and 225° or 135° and 315°.

The semiconductor device 1-1 can also achieve effects identical to those of the semiconductor device 1 according to the first embodiment. Further, by the semiconductor device 1-1, flexibility of the arrangement direction of the p-type transistor 10*b* is improved.

Other Embodiments

The present invention is not limited to the above embodiments and various modifications can be made without departing from the scope of the invention. For example, the semiconductor device according to the present invention is not limited to a NAND flash memory device including NAND flash memories.

Further, it suffices that the transistor 10a and the memory cell 20 are of a conductive type different from that of the transistor 10b (10b-1, 10b-2). For example, it is also applicable that the transistor 10a and the memory cell 20 are of p-type and the transistor 10b is of n-type. In this case, it suffices that the type of the impurity concentration explained in the above embodiments is inverted.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor device comprising:
   a first transistor formed on a substrate and comprising a first gate electrode and first source and drain regions;
   a second transistor formed on the substrate and comprising a second gate electrode and second source and drain regions of a conductive type different from that of the first source and drain regions;
   a first contact plug electrically connected to the first source and drain regions and comprising a first bottom surface which has a longitudinal direction and a short direction, a width of the first bottom surface in a direction parallel to a gate width direction of the first gate electrode being wider than a width of the first bottom surface in a direction parallel to a gate length direction of the first gate electrode;
   a second contact plug electrically connected to the second source and drain regions and comprising a second bottom surface, widths in all directions of the second bottom surface being narrower than a width of the first bottom surface in the longitudinal direction, and
   high-concentration impurity regions being formed between the first source and drain regions and the first contact plugs, the high-concentration impurity regions being a same conductive type as that of the first source and drain regions, wherein
   the first contact plug is electrically connected to the first source and drain regions through the high-concentration impurity regions,
   at least one of extending widths of an outline of the high-concentration impurity region extending from an outline of the first bottom surface in the longitudinal direction is larger than extending widths of an outline of the high-concentration impurity region extending from an outline of the first bottom surface in the short direction, and
   a shape of the outline of the high-concentration impurity region substantially matches a shape of the outline of the first bottom surface.

2. The device of claim 1, further comprising:
   a NAND memory cell string comprising serially connected memory cells on the substrate; and
   a third contact plug connected to third source and drain regions at an end of the NAND memory cell string and having a third bottom surface, all direction widths of the bottom surface of the third contact plug being narrower than the width of the first bottom surface in the longitudinal direction.

3. The device of claim 1, wherein the first contact plug is formed in a rectangular shape.

4. The device of claim 1, wherein the first contact plug is formed in an elliptical shape.

5. The device of claim 1, wherein the longitudinal direction of the first bottom surface substantially matches the gate width direction of the first gate electrode.

6. The device of claim 1 comprising:
   a third transistor on the substrate, the third transistor comprising a third gate electrode and third source and drain regions;
   a fourth contact plug electrically connected to the third source and drain regions and comprising a fourth bottom surface which has a longitudinal direction and a short direction, a width of the fourth bottom surface in a direction parallel to a gate width direction of the third gate electrode is wider than a width of the fourth bottom surface in a direction parallel to a gate length direction of the third gate electrode; and
   a second high-concentration impurity region being formed between the third source and drain regions and the fourth contact plug, the second high-concentration impurity region being a same conductive type as that of the third source and drain regions, wherein
   the fourth contact plug electrically connected to the third source and drain regions via the second high-concentration impurity region,
   at least one of extending widths of an outline of the second high-concentration impurity region extending from an outline of the fourth bottom surface in the longitudinal direction is wider than extending widths of an outline of the second high-concentration impurity region extending from an outline of the fourth bottom surface in the short direction, and
   a longitudinal direction of the fourth contact plug is substantially orthogonal to a longitudinal direction of the first contact plug.

7. The device of claim 1, wherein the outline of the high-concentration impurity region and the outline of the first bottom surface are formed in an elliptical shape.

8. The device of claim 7, wherein a long diameter direction of the outline of the high-concentration impurity region coincides with a long diameter direction of the outline of the first bottom surface.

9. The device of claim 1, wherein the outline of the high-concentration impurity region and the outline of the first bottom surface are formed in a rectangular shape.

10. The device of claim 9, wherein a longitudinal direction of the outline of the high-concentration impurity region coincides with a longitudinal direction of the outline of the first bottom surface.

* * * * *